(12) United States Patent
Apalkov et al.

(10) Patent No.: US 8,697,484 B2
(45) Date of Patent: Apr. 15, 2014

(54) METHOD AND SYSTEM FOR SETTING A PINNED LAYER IN A MAGNETIC TUNNELING JUNCTION

(75) Inventors: Dmytro Apalkov, San Jose, CA (US); Alexey Vasilyevitch Khvalkovskiy, Milpitas, CA (US); Vladimir Nikitin, Campbell, CA (US); Mohamad Towfik Krounbi, San Jose, CA (US); Xueti Tang, Fremont, CA (US); Se Chung Oh, Suwon (KR); Woo Chang Lim, Seongnam-si (KR); Jang Eun Lee, Suwon (KR); Ki Woong Kim, Yongin-si (KR); Kyoung Sun Kim, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 24 days.

(21) Appl. No.: 13/332,093

(22) Filed: Dec. 20, 2011

(65) Prior Publication Data
US 2013/0154034 A1    Jun. 20, 2013

(51) Int. Cl.
*H01L 29/82*    (2006.01)
(52) U.S. Cl.
USPC ............. 438/99; 365/173; 365/171; 365/158; 438/3; 438/158; 257/421; 257/4; 257/43; 257/E29.323; 257/E21.414; 257/E27.111; 257/E29.294; 257/E29.277

(58) Field of Classification Search
USPC ................. 257/421, 43, 72, 4; 365/173, 171; 438/3, 99
See application file for complete search history.

(56) References Cited

U.S. PATENT DOCUMENTS

| | | | |
|---|---|---|---|
| 6,906,949 B1 | 6/2005 | Nakamura et al. | |
| 7,800,942 B2 | 9/2010 | Chen et al. | |
| 7,940,600 B2 | 5/2011 | Dimitrov et al. | |
| 7,999,336 B2 | 8/2011 | Wang et al. | |
| 2007/0297220 A1 | 12/2007 | Yoshikawa et al. | |
| 2010/0080050 A1 | 4/2010 | Ozeki et al. | |
| 2010/0109110 A1 | 5/2010 | Wang et al. | |
| 2010/0270633 A1* | 10/2010 | Takenaga et al. | 257/421 |
| 2011/0102948 A1 | 5/2011 | Apalkov | |

* cited by examiner

*Primary Examiner* — Jerome Jackson, Jr.
*Assistant Examiner* — Bo Fan
(74) *Attorney, Agent, or Firm* — Convergent Law Group LLP

(57) ABSTRACT

A method and system for setting the direction of pinned layers in a magnetic junction are described. In one aspect, a magnetic field greater than the coercivity of the layers in a pinned layer but less than the coupling field between the layers is applied. In another aspect the pinned layers are switched from an anti-dual state to a dual state using a spin transfer torque current. In another aspect, a magnetic junction having a partial perpendicular anisotropy (PPMA) layer in the pinned layer is provided. In some aspects, the PPMA layer is part of a synthetic antiferromagnetic structure. In some embodiments, a decoupling layer is provided between the PPMA layer and another ferromagnetic layer in the pinned layer.

8 Claims, 7 Drawing Sheets

METHOD AND SYSTEM FOR SETTING A PINNED LAYER IN A MAGNETIC TUNNELING JUNCTION

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque magnetic random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional dual magnetic tunneling junction (MTJ) 10 as it may be used in a conventional STT-MRAM. The conventional dual MTJ 10 typically includes a first conventional pinned layer 12, a first conventional tunneling barrier layer 14, a conventional free layer 16, a second conventional tunneling barrier 18, and a second conventional pinned layer 20. The conventional tunneling barrier layers 14 and 18 are nonmagnetic and are typically a thin insulator such as MgO.

The conventional pinned layers 12 and 20 and the conventional free layer 16 are magnetic. The magnetic moment 13 of the conventional pinned layer 12 is fixed, or pinned, in a particular direction. Although depicted as a simple (single) layer, the conventional pinned layers 12 and 20 may include multiple layers. For example, the conventional pinned layer 12 and/or 20 may be a synthetic antiferromagnet (SAF) including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic.

The conventional free layer 16 has a changeable magnetic moment 17. Although depicted as a simple layer, the conventional free layer 16 may also include multiple layers. For example, the conventional free layer 16 may be a synthetic layer including magnetic layers antiferromagnetically or ferromagnetically coupled through thin conductive layers, such as Ru. The pinned layers 12 and 20 and free layer 20 have their magnetic moments 13, 21, and 17, respectively, oriented perpendicular to the plane of the layers.

To switch the magnetic moment 17 of the conventional free layer 16, a current is driven perpendicular to plane (in the z-direction). When a sufficient current is driven from the conventional pinned layer 12 toward the pinned layer 20, the magnetic moment 17 of the conventional free layer 16 may switch to be parallel to the magnetic moment 21 of the conventional pinned layer 20. When a sufficient current is driven from the conventional pinned layer 20 toward the conventional pinned layer 12, the magnetic moment 17 of the free layer 16 may switch to be parallel to that of the pinned layer 12. The differences in magnetic configurations correspond to different magnetoresistance levels and thus different logical states (e.g. a logical "0" and a logical "1") of the conventional MTJ 10.

FIG. 2 is a flow chart depicting a method 50 for setting the magnetic moments 13 and 21 of the pinned layers 12 and 20. Referring to FIGS. 1-2, for the purposes of the method 50, it is assumed that the pinned layer 12 has a higher coercivity than the pinned layer 20. Thus, a field, H1 shown in FIG. 1 that is in the desired direction of the magnetic moment 13 conventional pinned layer 12 is applied, via step 52. The magnitude of the field H1 is greater than the coercivities of both pinned layers 12 and 20. Thus, both magnetic moments 13 and 21 will be in the negative z direction while the field H1 is applied. This field is then removed. Thus, the magnetic moments 13 and 21 would be in the negative z direction after step 52 is performed.

Another field H2 is applied, via step 54. This field is in the positive z direction—the desired direction of the magnetic moment 21 of the conventional pinned layer 20. The magnitude of the field H2 is greater than the coercivity of the pinned layer 20 and less than the coercivity of the pinned layer 12. Thus, the magnetic field H2 does not disturb the state of the conventional pinned layer 12. However, the magnetic moment 21 of the conventional pinned layer 20 is switched to be in the positive z direction. Thus, the conventional pinned layers 12 and 20 are in a dual state (magnetic moments 13 and 21 antiparallel). In the dual state, the conventional free layer 17 may be more efficiently programmed using spin transfer. In addition, the field at the free layer 16 from the pinned layers 12 and 20 are in opposite directions and tend to cancel. As a result, the offset field at free layer 16 may be reduced.

Although the conventional MTJ 10 may be written using spin transfer and used in an STT-MRAM, there are drawbacks. There may be difficulties in setting the magnetic moments 13 and 21 of the pinned layers 12 and 20, respectively.

Accordingly, what is needed is a method and system for setting the magnetic moments of the pinned layers of magnetic junctions in the desired directions. The method and system described herein address such a need.

BRIEF SUMMARY OF THE INVENTION

A method and system for setting a layer of a magnetic junction usable in a magnetic device and a magnetic junction that might be set are described. In one aspect, the method of setting a reference layer of a pinned layer in magnetic junction including a free layer, a nonmagnetic spacer layer, and the pinned layer is described. The nonmagnetic spacer layer is between the pinned layer and the free layer. The pinned layer includes a plurality of ferromagnetic layers interleaved with at least one spacer layer. The ferromagnetic layers have at least one easy axis. A magnetic field is applied in a direction parallel to an easy axis of the ferromagnetic layers. The magnetic field has a magnitude greater than a coercivity of each of the layers and less than a coupling field between a portion of the layers.

In another aspect, the method for setting a first pinned layer in magnetic junction including the first pinned layer, a first nonmagnetic spacer layer, a free layer, a second nonmagnetic spacer layer, and a second pinned layer is described. The first nonmagnetic spacer layer is between the first pinned layer and the free layer. The second nonmagnetic spacer layer is between the second pinned layer and the free layer. The first pinned layer has at least one easy axis. The first and second pinned layers are in an anti-dual state. The first pinned layer has a first coercivity less than a second coercivity of the second pinned layer. The method includes switching the first pinned layer using a spin transfer current driven through the magnetic junction such that the first pinned layer and the second pinned layer are in a dual state.

In a third aspect, a magnetic junction is described. The magnetic junction includes a free layer, a nonmagnetic spacer layer, and a pinned layer. The nonmagnetic spacer layer is between the pinned layer and the free layer. The pinned layer includes a partial perpendicular magnetic anisotropy (PPMA) layer that may have enhanced spin polarization next to the nonmagnetic spacer. Similarly, in a fourth aspect, a magnetic junction is described. The magnetic junction includes a first pinned layer, a first nonmagnetic spacer layer, a free layer, a second nonmagnetic spacer layer, and a second pinned layer. The second nonmagnetic spacer layer is between the second pinned layer and the free layer. The first nonmagnetic spacer layer is between the first pinned layer and the free layer. At least one of the first pinned layer and the second pinned layer includes a plurality of ferromagnetic layers interleaved with at least one nonmagnetic layer. The ferromagnetic layers are ferromagnetically aligned. One of the ferromagnetic layers closest to the free layer is a PPMA layer with high spin polarization.

DETAILED DESCRIPTION OF THE INVENTION

Figure 1:
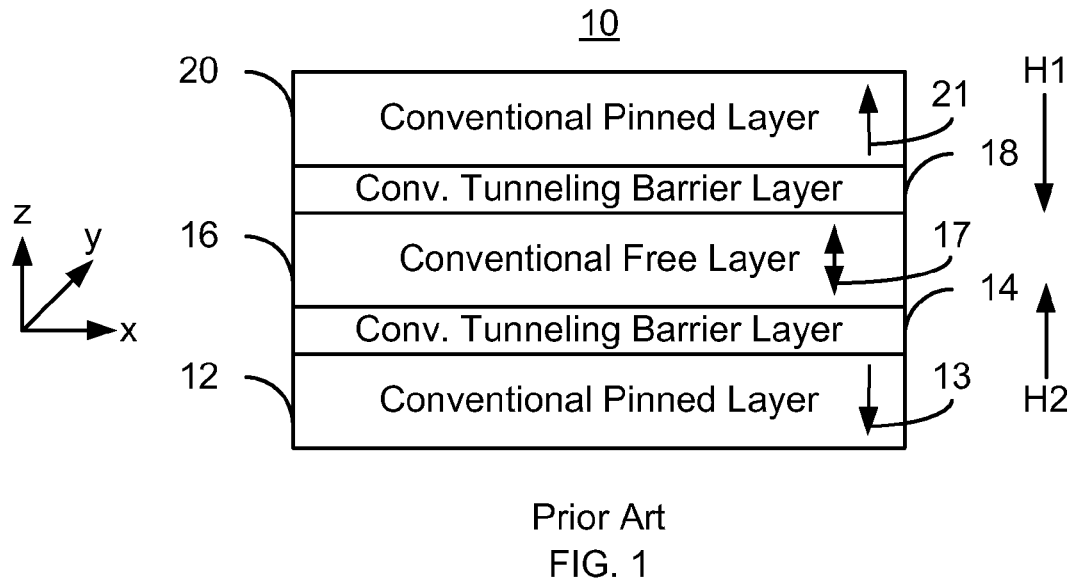
FIG. 1 depicts a conventional magnetic junction.
Figure 2:
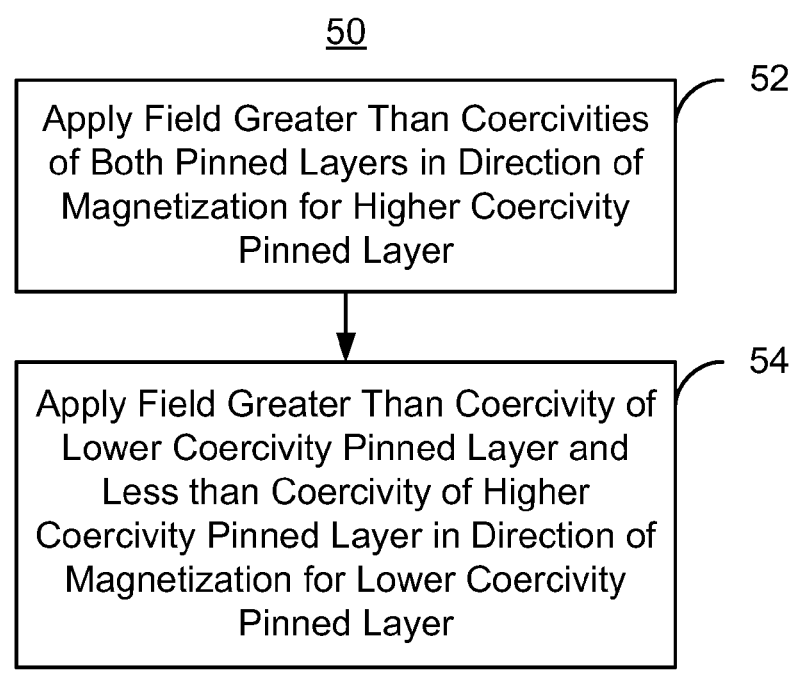
FIG. 2 depicts a conventional method for setting the magnetic moments of the pinned layers.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments describe methods and systems for providing a magnetic junction as well as a magnetic memory utilizing the magnetic junction. In one aspect, the method sets a reference layer of a pinned layer in magnetic junction including a free layer, a nonmagnetic spacer layer, and the pinned layer. The nonmagnetic spacer layer is between the pinned layer and the free layer. The pinned layer includes a plurality of ferromagnetic layers interleaved with at least one spacer layer. The ferromagnetic layers have at least one easy axis. A magnetic field is applied in a direction parallel to an easy axis of the ferromagnetic layers. The magnetic field has a magnitude greater than a coercivity of each of the layers and less than a coupling field between a portion of the layers.

In another aspect, the method for setting a first pinned layer in magnetic junction including the first pinned layer, a first nonmagnetic spacer layer, a free layer, a second nonmagnetic spacer layer, and a second pinned layer is described. The first nonmagnetic spacer layer is between the first pinned layer and the free layer. The second nonmagnetic spacer layer is between the second pinned layer and the free layer. The first pinned layer has at least one easy axis. To describe this method, we assume that the initial state corresponds to the first and second pinned layers being in an anti-dual state. If they are in dual state (antiparallel to each other), this is generally the desired state and any additional setting procedure may be omitted. The first pinned layer has a first coercivity less than a second coercivity of the second pinned layer. The method includes switching the first pinned layer using a spin transfer current driven through the magnetic junction such that the first pinned layer and the second pinned layer are in a dual state.

In a third aspect, a magnetic junction is described. The magnetic junction includes a free layer, a nonmagnetic spacer layer, and a pinned layer. The nonmagnetic spacer layer is between the pinned layer and the free layer. The pinned layer includes a partial perpendicular magnetic anisotropy (PPMA) layer. Similarly, in a fourth aspect, a magnetic junction is described. The magnetic junction includes a first pinned layer, a first nonmagnetic spacer layer, a free layer, a second nonmagnetic spacer layer, and a second pinned layer. The second nonmagnetic spacer layer is between the second pinned layer and the free layer. The first nonmagnetic spacer layer is between the first pinned layer and the free layer. At least one of the first pinned layer and the second pinned layer includes a plurality of ferromagnetic layers interleaved with at least one nonmagnetic layer. The ferromagnetic layers are antiferromagnetically aligned. One of the ferromagnetic layers closest to the free layer is a PPMA layer.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and substructures. However, one of ordinary skill in the art will readily recognize that the method and system are consistent with the use of magnetic memories having multiple magnetic junctions and using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 3:
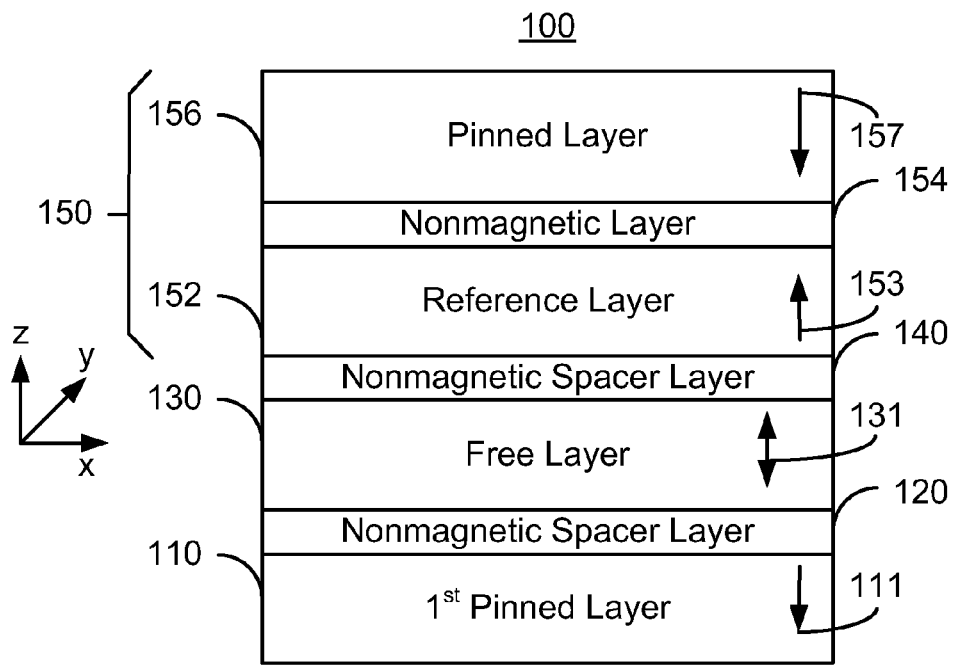
FIG. 3 depicts an exemplary embodiment of a magnetic junction capable of being written using spin transfer.

FIG. 3 depicts an exemplary embodiment of a magnetic junction 100 usable in a magnetic memory, such as an STT-MRAM. For clarity, FIG. 3 is not to scale. The magnetic junction 100 includes a first pinned layer 110, a first nonmagnetic spacer layer 120, a free layer 130, a second nonmagnetic spacer layer 140, and a second pinned layer 150. The pinned layer 150 is a SAF structure including ferromagnetic layers 152 and 156 having magnetic moments 153 and 157, respectively. The ferromagnetic layer 152 is termed a reference layer, while the ferromagnetic layer 156 is termed a pinned layer 156. The layers 152 and 156 are separated by a nonmagnetic layer 154 that may be Ru. In the embodiment shown, the pinned layer 156 has a higher magnetic moment than the reference layer 152. In addition, the layers 152 and 156 may have different coercivities. In the embodiment shown, the magnetic moments 111, 131, 153 and 157 are perpendicular to plane. Thus, the each of the layers 110, 130, 152, and 156 has a perpendicular anisotropy field that exceeds its out-of-plane demagnetizing field ($4\pi M_s$). Further, although the pinned layer 150 that is a SAF is shown on top of the free layer 130, the orientation of the layers may differ. For example, the pinned layer 150 may be at the bottom, while the pinned layer 110 is at the top.

Although depicted as a simple layer, the pinned layer 110 may include multiple layers. For example, the pinned layer 110 may be a SAF including magnetic layers antiferromagnetically or ferromagnetically coupled through thin layers, such as Ru. In such a SAF, multiple magnetic layers interleaved with thin layer(s) of Ru or other material may be used. The pinned layer 110 may also be another multilayer.

The free layer 130 is magnetic and thus includes at least one of Co, Ni, and Fe. The free layer 130 is configured to be switchable between a plurality of stable magnetic states when a write current is passed through the magnetic junction 100. The free layer 130 is also depicted as a single layer but may include multiple layers. For example, the free layer 130 might also be a SAF. In other embodiments, other multilayers may be used for the free layer 130 and/or the pinned layer 110.

Each of the spacer layers 120 and 140 is nonmagnetic. In some embodiments, each spacer layer 120 and/or 140 is an insulator, for example a tunneling barrier. In such embodiments, each spacer layer 120 and/or 140 may include crystalline MgO, which may enhance the TMR of the magnetic junction. In other embodiments, each spacer layer 120 and/or 140 may be a conductor, such as Cu. In alternate embodiments, each spacer layer 120 and/or 140 might have another structure, for example a granular layer including conductive channels in an insulating matrix. Finally, in other embodiments, the spacer layers 120 may differ in structure. For example, one spacer layer 120 and/or 140 might be conductive while the other is insulating. Such spacer layers 120 and 140 may thus alternate in conductivity or have some other relationship.

Figure 4:
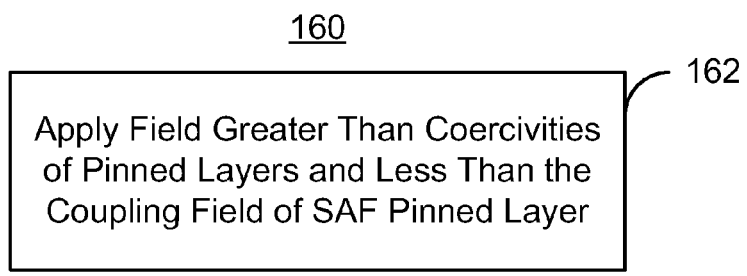
FIG. 4 is a flow chart depicting one embodiment of a method for setting the magnetic moments of the pinned layers of the magnetic junction.

The magnetic moments 111 and 153 are desired to be set antiparallel, such that the magnetic junction 100 is in a dual state. Such a state may improve spin transfer efficiency and reduce the offset field at the free layer 130. FIG. 4 depicts one embodiment of a method 160 for setting the magnetic moment 153 of the reference layer 152 in the desired state. For simplicity, some steps may be omitted, combined, and/or interleaved. The method 160 is described in the context of the magnetic junction 100. However, the method 160 may be used to set the magnetic moments of the pinned layers of other magnetic junctions.

A single magnetic field is applied, via step 162. The magnetic field is applied in a direction along the desired final state of the layer having the higher saturation moment. In the magnetic junction 100, this is the pinned layer 156 furthest from the pinned layer 110. For the magnetic junction 100, this direction is along the z axis, or perpendicular to plane. The magnetic field has a magnitude greater than a coercivity of each of the layers 152 and 156 in the pinned layer 150 and greater than the coercivity of the other pinned layer 110. Thus, the magnetic field is used to set the layers 110 and 156. However, less than a coupling field between the ferromagnetic layers 152 and 156 of the pinned layer 150. The magnetic field is then removed.

Because the magnetic field is larger than the coercivities of the layers 110, 152, and 156, the magnetic moments 111 and 157 are set by the application of the field in step 162. However, the magnetic field applied in step 162 is less than the coupling between the layers 152 and 156. Consequently, the magnetic moment 157 of the pinned layer 156 being set in the same direction as the applied field causes the magnetic moment 153 of the reference layer 152 to be in the opposite direction. In the embodiment shown, the pinned layer 156 has a saturation magnetic moment greater than the saturation magnetic moment of the remaining ferromagnetic layer 152. Thus, in the embodiment shown, the magnetic field applied in step 162 sets the magnetization direction of the higher saturation magnetic moment layer.

In the embodiment shown, magnetic field applied in step 162 is in the magnetization direction of the ferromagnetic pinned layer 156 of the SAF pinned layer 150. In another embodiment, the magnetic field applied in step 162 is in the desired magnetization direction of the reference layer 152. Further, the method 160 is used in setting the magnetic moments of the layers 110, 152, and 156. In another embodiment, the method 160 might be used on a single magnetic junction, for example, a magnetic junction analogous to the magnetic junction 100 in which the layers 110 and 120 are omitted. In such an embodiment, the method 160 still sets the magnetization directions of the layers 152 and 156. In another embodiment, the applied field can be tilted towards the plane of the structure. In yet another embodiment, the applied field can be substantially in-plane of the structure or can be a combination of the in-plane and/or perpendicular fields, which are applied/removed at different time instances.

Thus, using the method 160, direction of magnetization of the layers 152 and 156 are set. In particular, a single magnetic field may be used to set the directions of the magnetic moments 153 and 157. Thus, even for a single magnetic junction including a single SAF layer, the magnetization directions of the pinned layer 156 and reference layer 152 of the SAF may be set with a single magnetic field. Further, in a dual magnetic junction, the direction of the magnetic moment 111 of the remaining pinned layer 110 may also be set in a single application of a field. The pinned layer(s) of a magnetic junction may thus be set such that the offset field at the free layer is reduced and such that the spin transfer torque efficiency may be improved.

Figure 5:
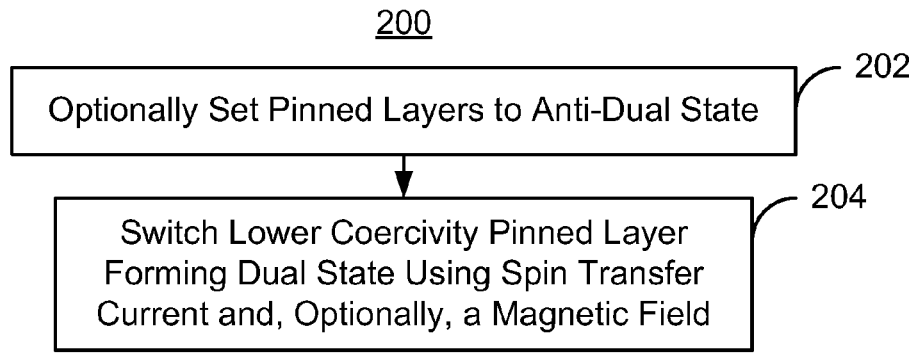
FIG. 5 is a flow chart depicting another embodiment of a method for setting the magnetic moments of the pinned layers of the magnetic junction.
Figure 6A:
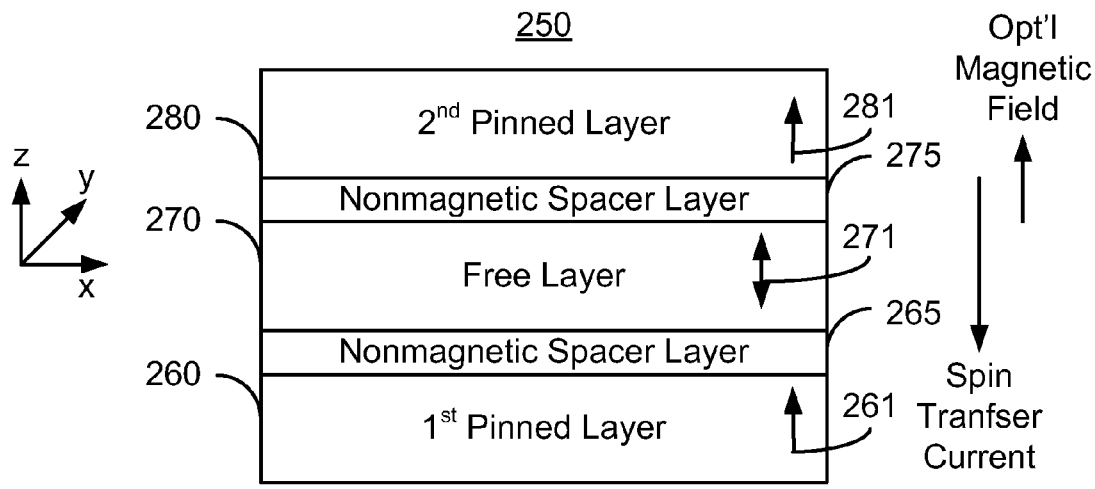
FIGS. 6A-6B depicts another exemplary embodiment of a magnetic junction capable of being written using spin transfer.
Figure 6B:
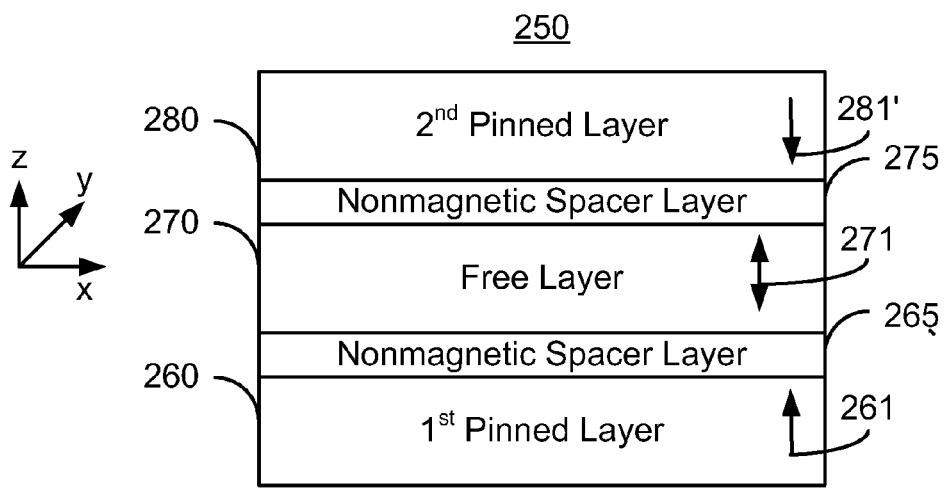

FIG. 5 depicts one embodiment of a method 200 for setting the magnetic moment of the pinned layers of a dual magnetic junction in the desired state. For simplicity, some steps may be omitted, combined, and/or interleaved. FIGS. 6A and 6B depict one embodiment of a magnetic junction 250 that may be usable in a magnetic memory, such as an STT-MRAM, and that is set using the method 200. For clarity, FIGS. 6A-6B are not to scale. The method 200 is described in the context of the magnetic junction 250. However, the method 200 may be used to set the magnetic moments of the pinned layers of other magnetic junctions.

Initially, the magnetic junction 250 may be in an undefined state. More specifically, it may not be known whether the pinned layers are in a dual state (magnetic moments antiparallel) or an anti-dual state (magnetic moments parallel). Thus, the pinned layers may optionally be set to be in the anti-dual state, via step 202. In some embodiments, step 202 includes applying a magnetic field in the desired direction, along the easy axes one or more of the pinned layers. The magnitude of such a magnetic field is greater than the coercivities of the pinned layers.

FIG. 6A depicts the magnetic junction 250 in the anti-dual state, after step 202 is completed. The magnetic junction 250 includes a pinned layer 260, a first nonmagnetic spacer layer 265, a free layer 270, a second nonmagnetic spacer layer 275, and a second pinned layer 280. The pinned layers 260 and 280 may have different coercivities. For clarity, in the embodiment shown, the pinned layer 280 has a lower coercivity than the pinned layer 260. In the embodiment shown, the magnetic moments 261, 271, and 281 are perpendicular to plane. Thus, the each of the layers 261, 271, and 281 has a perpendicular anisotropy field that exceeds its out-of-plane demagnetization field ($4\pi M_s$). Further, although the pinned layer 280 having a lower coercivity is shown on top of the free layer 270, the orientation of the layers may differ. For example, the pinned layer 280 may be at the bottom, while the pinned layer 260 is at the top. Although depicted as simple layers, the pinned layer 260 and/or 280 may include multiple layers. For example, the pinned layer 260 and/or 280 may be a SAF including magnetic layers antiferromagnetically or ferromagnetically coupled through thin layers, such as Ru. In such a SAF, multiple magnetic layers interleaved with thin layer(s) of Ru or other material may be used. The pinned layers 260 and/or 280 may also be another multilayer.

The free layer 270 is magnetic and thus includes at least one of Co, Ni, and Fe. The free layer 270 is configured to be switchable between a plurality of stable magnetic states when a write current is passed through the magnetic junction 250. The free layer 270 is also depicted as a single layer but may include multiple layers. For example, the free layer 270 might also be a SAF. In other embodiments, other multilayers may be used for the free layer 270.

Each of the spacer layers 265 and 275 is nonmagnetic. In some embodiments, each spacer layer 265 and/or 275 is an insulator, for example a tunneling barrier. In such embodiments, each spacer layer 265 and/or 275 may include crystalline MgO, which may enhance the TMR of the magnetic junction. In other embodiments, each spacer layer 265 and/or 275 may be a conductor, such as Cu. In alternate embodiments, each spacer layer 265 and/or 275 might have another structure, for example a granular layer including conductive channels in an insulating matrix.

As can be seen in FIG. 6A, application of the magnetic field in step 202 has resulted in an antidual state, with magnetic moments 261 and 281 parallel. In a dual state, the spin torque contributions of the pinned layers 260 and 280 on the free layer 270 may substantially cancel. Thus, a spin transfer current may be applied to the magnetic junction 250 without switching the free layer 270.

The pinned layer 280 having a lower coercivity is switched using a spin transfer current driven through the magnetic junction 200, via step 204. In some embodiments, step 204 includes applying a current from the higher coercivity layer to the lower coercivity layer. In some such embodiments, only the spin transfer current is used to switch the magnetic moment 281 of the pinned layer 280. However, in other embodiments, an additional field may be used in step 204. This magnetic field would be in the direction in which the lower coercivity layer is desired to lie. Such a magnetic field and spin transfer current are also shown in FIG. 6A.

FIG. 6B depicts the magnetic junction 250 after step 204 is performed. Thus, the pinned layer 260 and the pinned layer 280 are in a dual state. More specifically, the pinned layer 280 has been switched so that the magnetic moment 281' has switched. The dual state is desired to increase the spin transfer torque on the free layer 270 for programming.

Thus, using the method 200, the magnetic junction 250 may be set in the desired, dual state. Although described in connection with single layers, the method 200 may also be used for a magnetic junction in which one or more of the pinned layers 260 and 280 are multilayers, including SAFs. In such a case, the ferromagnetic layer closest to the opposing pinned layer may be switched first using spin transfer.

The method 200 shares some of the benefits of the method 150. In particular, the magnetic moments of the pinned layers 260 and 280 may be reliably set in the desired states. Further, this may be accomplished in a relatively simple manner. The pinned layer(s) of a magnetic junction may thus be set such that the offset field at the free layer is reduced and such that the spin transfer torque efficiency may be improved. Thus, use of the magnetic junction 250 may be improved.

Figure 7:
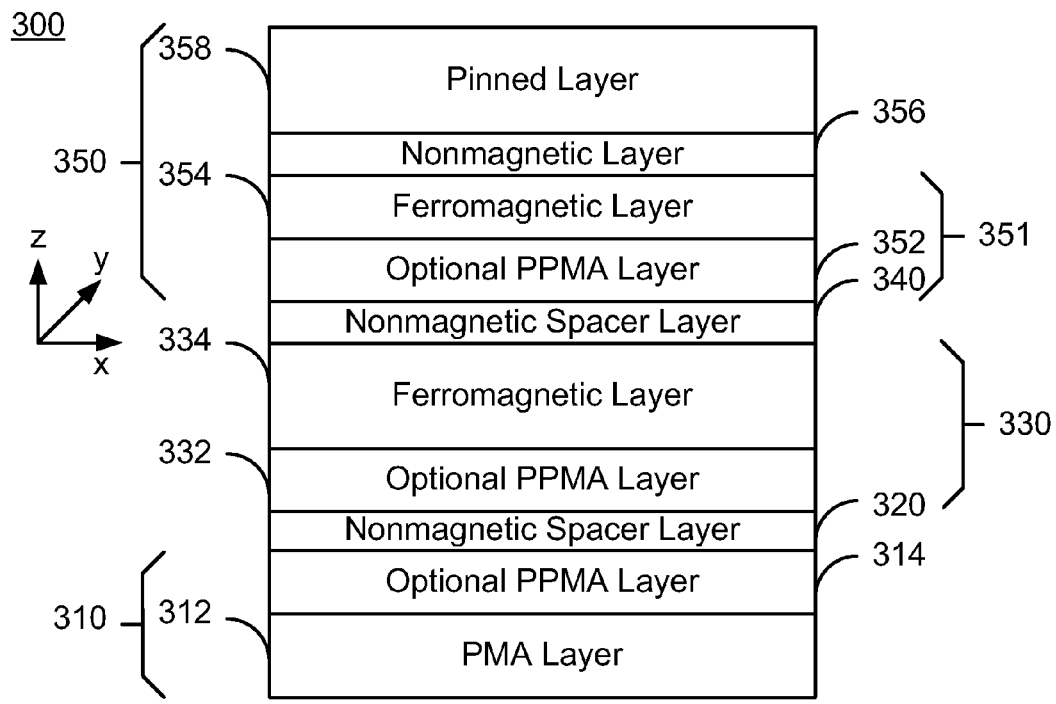
FIG. 7 depicts another exemplary embodiment of a magnetic junction capable of being written using spin transfer.

FIG. 7 depicts an exemplary embodiment of a magnetic junction 300 usable in a magnetic memory such as an STT-MRAM. For clarity, FIG. 7 is not to scale. Further, the magnetic junction may be set into the desired state using the method 150 and/or 160. Further, the magnetic junction 300 is configured such that the magnetic moment of the layers are perpendicular to plane. The magnetic junction 300 includes a pinned layer 310, a first nonmagnetic spacer layer 320, a free layer 330, a second nonmagnetic spacer layer 340, and a second pinned layer 350.

The pinned layer 350 is a SAF structure including ferromagnetic layers 351 and 358 separated by a nonmagnetic layer 356 that may be Ru. The ferromagnetic layer 351 is a reference layer, while the layer 358 is a pinned layer. The pinned layer 358 has a high perpendicular magnetic anisotropy (PMA). For example, the pinned layer 358 may include alloys such CoFeB, CoPd, CoPt, FePt, FePd, CoFeTb, CoFeGe as simple layers and/or multilayers such as Co/Pd, Co/Pt, Fe/Pd, Fe/Pt, Co/Ru. As a result, the magnetic moment of the pinned layer 358 (not shown) is perpendicular to plane, or along the z-axis. The direction in which the magnetic moment would lie depends upon how the magnetic junction 300 is set using the methods 160 and 200. The reference layer 351 may be a multilayer. Thus, a ferromagnetic layer 354 and a partial perpendicular magnetic anisotropy (PPMA) layer 352 are shown. The ferromagnetic layer 354 has a strong perpendicular magnetic anisotropy (PMA). A partial perpendicular magnetic anisotropy layer is a layer in which the perpendicular anisotropy energy is close to the out of plane demagnetization energy but is not sufficiently high to make it perpendicular to the plane and stable. For example, the partial perpendicular magnetic anisotropy field may be at least fifty percent of the demagnetization field. In some such embodiments, the partial perpendicular magnetic anisotropy field is not more than eighty percent of the demagnetization field. Thus, without the effects of adjacent layers, the magnetic moment of a PPMA layer would lie in plane or be unstable. In the discussed embodiments however the PPMA layer, since it is strongly coupled to the adjacent layer with high PMA, has magnetization perpendicular to the plane and is sufficiently stable. For example, the PPMA layer may include one or more of Co, Fe, Ni and their alloy with other nonmagnetic element such as CoFeB, FeB, CoFeHf, CoFeGe, CoFeZr. In addition, the PPMA layer may include a multilayer. For example, the PPMA layer may include or consist of Co/Pd, Co/Pt, Fe/Pd, Fe/Pt, Co/Ru However, in the embodiment shown, the ferromagnetic layer 354 is also a PMA layer. A PMA layer may include a multilayer. For example, the PPMA layer may include or consist of Co/Pd, Co/Pt, Fe/Pd, Fe/Pt, Co/Ru As a result, the PPMA layer 352 would also have a magnetic moment perpendicular to plane.

The free layer 330 is magnetic and thus includes at least one of Co, Ni, and Fe. The free layer 330 is configured to be switchable between a plurality of stable magnetic states when a write current is passed through the magnetic junction 300. The free layer is shown as including an optional PPMA layer 332 and a ferromagnetic layer 334. In some embodiments, the PPMA layer 332 may be omitted. Thus, the free layer 330 may be a single layer. In other embodiments, the PPMA layer 332 may be on the opposite side of the ferromagnetic layer 334. In still other embodiments, PPMA layers may adjoin the ferromagnetic layer 334 on its top and bottom. In other embodiments, the free layer 330 may be another multilayer.

Each of the spacer layers 320 and 340 is nonmagnetic. In some embodiments, each spacer layer 320 and/or 340 is an insulator, for example a tunneling barrier. In such embodiments, each spacer layer 320 and/or 340 may include crystalline MgO, which may enhance the TMR of the magnetic junction. In other embodiments, each spacer layer 320 and/or 340 may be a conductor, such as Cu. In alternate embodiments, each spacer layer 320 and/or 340 might have another structure, for example a granular layer including conductive channels in an insulating matrix. Finally, in other embodiments, the spacer layers 120 may differ in structure. For example, one of spacer layers 320 and/or 340 might be conductive while the other is insulating. Such spacer layers 320 and 340 may thus alternate in conductivity or have some other relationship.

The pinned layer 310 is a multilayer including ferromagnetic layers 312 and 314. The ferromagnetic layer 314 is a PPMA layer 314, while the layer 312 is a PMA layer. As a result of the coupling between layers 312 and 314, the PPMA layer 314 would also have a magnetic moment perpendicular to plane. Further, in other embodiments, the pinned layer 310 may be another multilayer including but not limited to a SAF.

Thus, the magnetic junction 300 is one in which one or more of the pinned layer 310, the free layer 330 and the pinned layer 350 include PPMA layer(s) adjoining the nonmagnetic spacer layer 320 and/or 340. The magnetic moments of the layers 310, 330, and 350 are perpendicular to plane. As a result, the magnetic junction 300 may have enhanced magnetoresistance. Thus, in addition to being able to have its pinned layer magnetic moment(s) set using the method 160 or 200, the magnetic junction 300 may have enhanced magnetoresistance.

Figure 8:
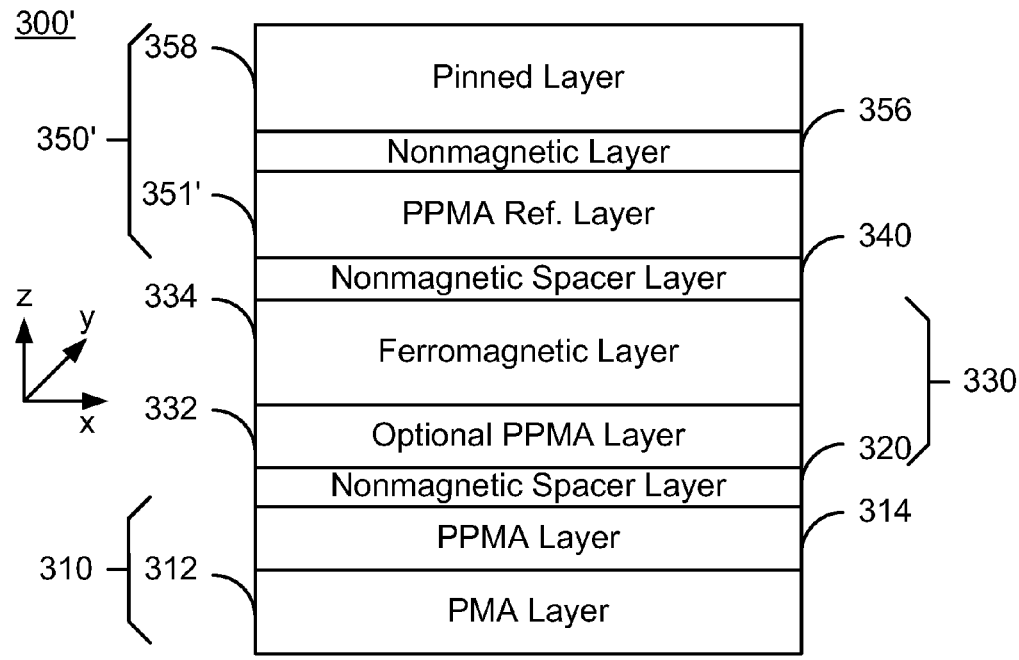
FIG. 8 depicts another exemplary embodiment of a magnetic junction capable of being written using spin transfer.

FIG. 8 depicts an exemplary embodiment of a magnetic junction 300' usable in a magnetic memory such as an STT-MRAM. For clarity, FIG. 8 is not to scale. Further, the magnetic junction may be set into the desired state using the method 150 and/or 160. The magnetic junction 300' is analogous to the magnetic junction 300. Consequently, similar components have analogous labels. The magnetic junction 300' thus includes a pinned layer 310, a nonmagnetic spacer layer 320, a free layer 330, another nonmagnetic spacer layer 340, and a pinned layer 350' that are analogous to the pinned layer 310, the first nonmagnetic spacer layer 320, the free layer 330, the second nonmagnetic spacer layer 340, and the second pinned layer 350 depicted in FIG. 7. Thus, the structure and function of these components is analogous to that described above.

In addition, the pinned layer 350' includes a reference layer 351' that is analogous to the reference layer 351 of the magnetic junction 300. However, the PPMA layer is the reference layer 351' in the magnetic junction 300. In this case, the PPMA reference layer 351' still has its magnetic moment perpendicular to plane. Instead of the PPMA layer 352 being directly exchanged coupled to an adjoining PMA layer, the PPMA reference layer 352 is coupled to the pinned layer 358 through the nonmagnetic layer 356. This interaction is sufficient that the PPMA reference layer 351' has its magnetic moment perpendicular to plane and has sufficiently high thermal stability.

The magnetic junction 300' may share the benefits of the magnetic junction 300 in which one or more of the pinned layer 310, the free layer 330 and the pinned layer 350 include PPMA layer(s) adjoining the nonmagnetic spacer layer 320 and/or 340. The magnetic moments of the layers 310, 330, and 350' are perpendicular to plane. As a result, the magnetic junction 300' may have enhanced magnetoresistance. Thus, in addition to being able to have its pinned layer magnetic moment(s) set using the method 160 or 200, the magnetic junction 300' may have enhanced magnetoresistance.

Figure 9:
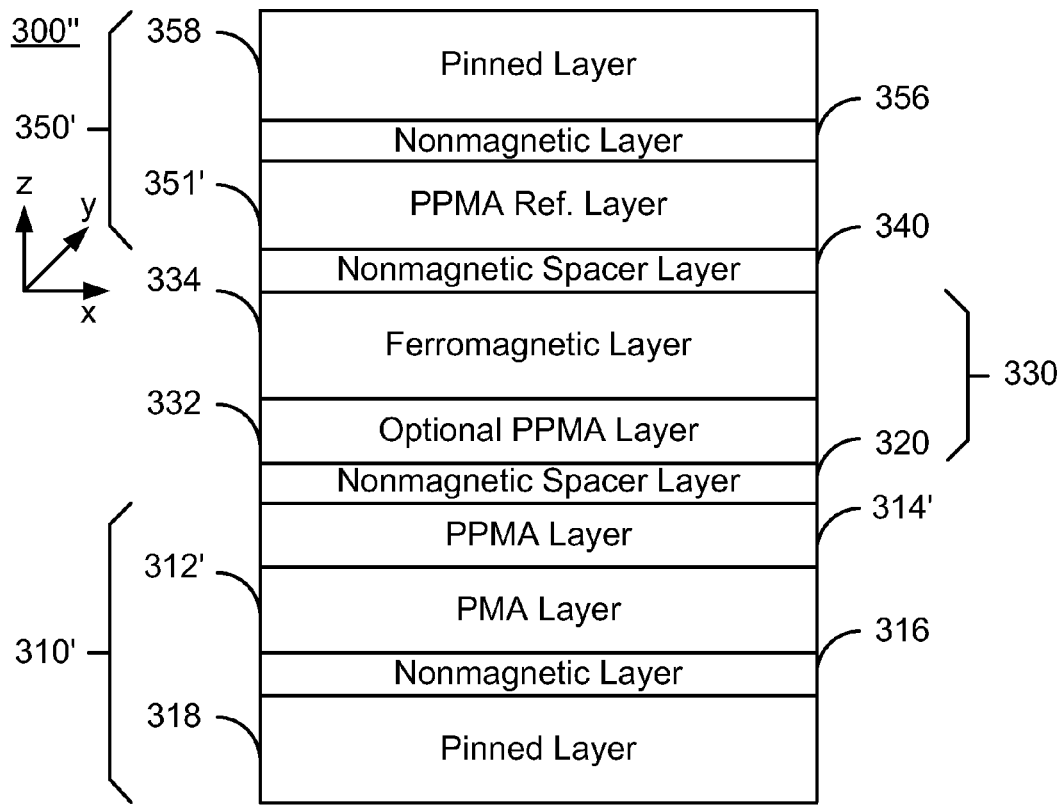
FIG. 9 depicts another exemplary embodiment of a magnetic junction capable of being written using spin transfer.

FIG. 9 depicts an exemplary embodiment of a magnetic junction 300' usable in a magnetic memory such as an STT-MRAM. For clarity, FIG. 9 is not to scale. Further, the magnetic junction may be set into the desired state using the method 150 and/or 160. The magnetic junction 300" is analogous to the magnetic junction(s) 300 and 300'. Consequently, similar components have analogous labels. The magnetic junction 300" thus includes a pinned layer 310', a nonmagnetic spacer layer 320, a free layer 330, another nonmagnetic spacer layer 340, and a pinned layer 350' that are analogous to the pinned layer 310/310, the first nonmagnetic spacer layer 320/320, the free layer 330/330, the second nonmagnetic spacer layer 340, and the second pinned layer 350/350' depicted in FIGS. 7 and 9. Thus, the structure and function of these components is analogous to that described above.

In addition, the pinned layer 310' is a SAF including pinned layer 318 and nonmagnetic layer 316 in addition to layers 312' and 314' that form a reference layer. Thus, both pinned layers 310' and 350' may be a SAF. Further, although PMA layer 312' is shown, in some embodiments, this layer may be omitted. Thus, in a manner similar to the layer 350', the PPMA layer 314' may function as a reference layer. The magnetic moment of such a reference layer would be perpendicular to plane.

The magnetic junction 300" may share the benefits of the magnetic junctions 300 and/or 300' in which one or more of the pinned layer 310', the free layer 330 and the pinned layer 350' include PPMA layer(s) adjoining the nonmagnetic spacer layer 320 and/or 340. The magnetic moments of the layers 310, 330, and 350' are perpendicular to plane. As a result, the magnetic junction 300" may have enhanced magnetoresistance. Thus, in addition to being able to have its pinned layer magnetic moment(s) set using the method 160 or 200, the magnetic junction 300" may have enhanced magnetoresistance.

Figure 10:
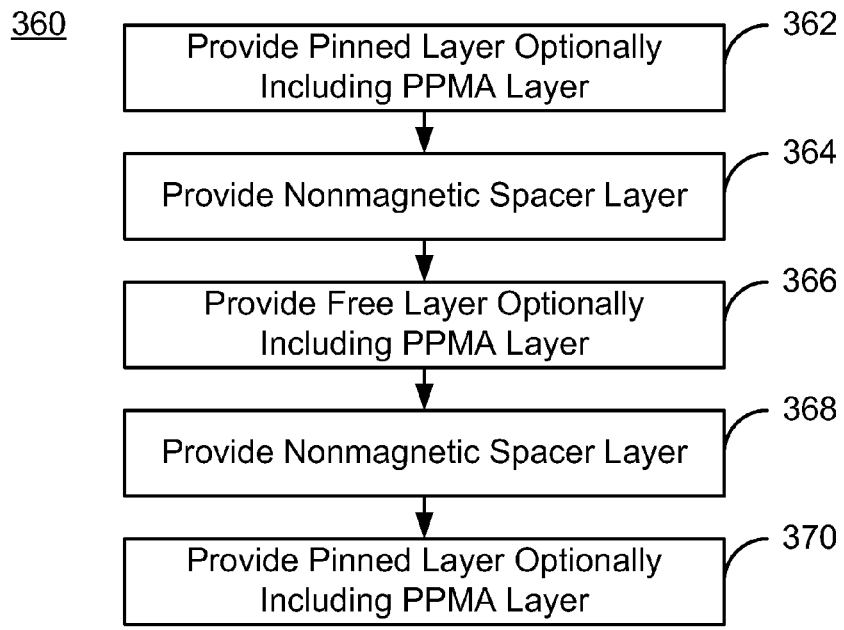
FIG. 10 is a flow chart depicting one embodiment of a method for providing the magnetic junction.

FIG. 10 depicts one embodiment of a method 360 for providing an exemplary embodiment of a dual magnetic junction. For simplicity, some steps may be omitted, combined, and/or interleaved. The method 360 is described in the context of the magnetic junction 300. However, the method 360 may be used to provide other magnetic junctions.

Figure 11:
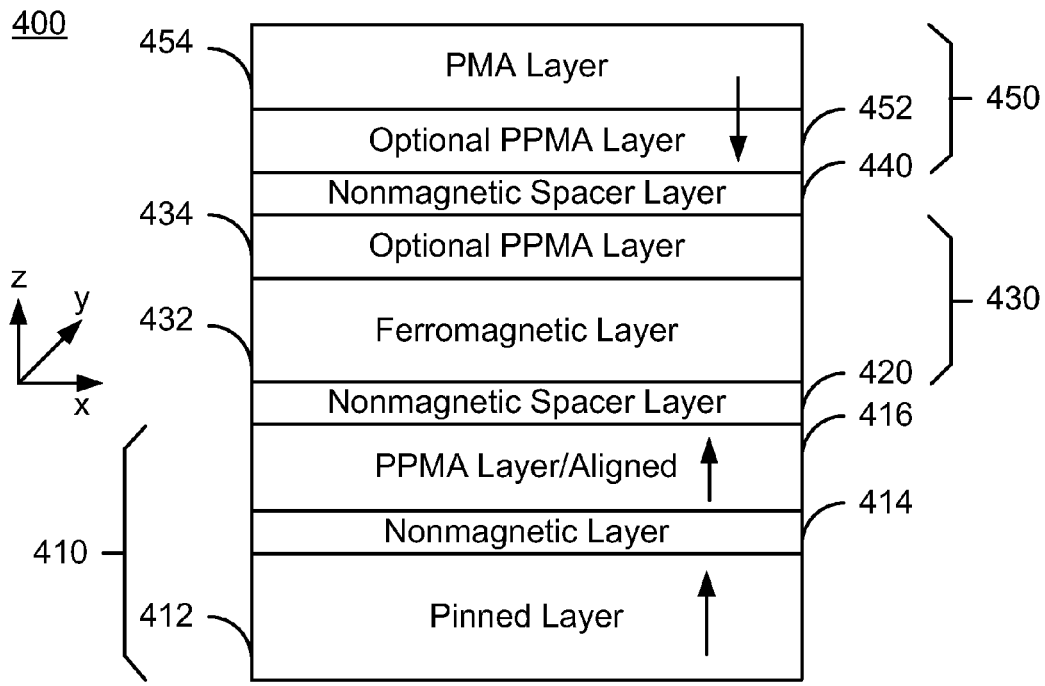
FIG. 11 depicts another exemplary embodiment of a magnetic junction capable of being written using spin transfer

The pinned layer 310 is provided, via step 362. In some embodiments, step 362 includes providing a multilayer including a PPMA layer. In some such embodiments, the pinned layer 310 provided may be a SAF. The nonmagnetic spacer 320 is provided, via step 364. In some embodiments, step 364 includes providing a tunneling barrier layer. The free layer 330 is provided via step 366. In some embodiments, the free layer 330 provided may include one or more PPMA layers. Another nonmagnetic spacer layer 340 is provided, via step 368. The pinned layer 350 is provided, via step 370. Step 370 may include providing a PPMA layer as part of the pinned layer 350. Thus, using the method 360, the benefits of one or more of the magnetic junctions 300, 300', and 300" may be achieved FIG. 11 depicts an exemplary embodiment of a magnetic junction 300 usable in a magnetic memory such as an STT-MRAM. For clarity, FIG. 11 is not to scale. Further, the magnetic junction may be set into the desired state using the method 150 and/or 160. Further, the magnetic junction 400 is configured such that the magnetic moment of the layers is perpendicular to plane. The magnetic junction 400 includes a pinned layer 410, a first nonmagnetic spacer layer 420, a free layer 430, a second nonmagnetic spacer layer 440, and a second pinned layer 450.

The pinned layer 410 is a multilayer including ferromagnetic layers 412 and 416 separated by a nonmagnetic layer 414 with strong ferromagnetic or antiferromagnetic interlayer exchange coupling that may be Ru or Ta. The ferromagnetic layer 416 is a reference layer, while the layer 412 is a pinned layer. The pinned layer 412 may be a PMA layer. As a result, the magnetic moment of the pinned layer 412 is perpendicular to plane, or along the z-axis. Although shown as pointing in the positive direction, the direction in which the magnetic moment of the pinned layer 412 would lie depends upon how the magnetic junction 400 is set using the methods 160 and 200. The reference layer 416 may include a PPMA layer. Although shown as a single PPMA layer, the reference layer 416 might be a multilayer. Because of the coupling with the pinned layer 412, the PPMA reference layer 416 has a magnetic moment that is perpendicular to plane. However, the layers 416 and 412 are not antiferromagnetically aligned. Instead, these layers are ferromagnetically aligned.

The free layer 430 is magnetic and thus includes at least one of Co, Ni, and Fe. The free layer 430 is configured to be switchable between a plurality of stable magnetic states when a write current is passed through the magnetic junction 400. The free layer is shown as including an optional PPMA layer 434 and a ferromagnetic layer 432. In some embodiments, the PPMA layer 434 may be omitted. Thus, the free layer 430 may be a single layer. In other embodiments, the PPMA layer 432 may be on the opposite side of the ferromagnetic layer 434. In still other embodiments, PPMA layers may adjoin the ferromagnetic layer 332 on its top and bottom. In other embodiments, the free layer 430 may be another multilayer.

Each of the spacer layers 420 and 440 is nonmagnetic. In some embodiments, each spacer layer 420 and/or 440 is an insulator, for example a tunneling barrier. In such embodiments, each spacer layer 420 and/or 440 may include crystalline MgO, which may enhance the TMR of the magnetic junction. In other embodiments, each spacer layer 420 and/or 440 may be a conductor, such as Cu. In alternate embodiments, each spacer layer 420 and/or 440 might have another structure, for example a granular layer including conductive channels in an insulating matrix. Finally, in other embodiments, the spacer layers 420 and/or 440 may differ in structure. For example, one of the spacer layers 420 and/or 440 might be conductive while the other is insulating. Such spacer layers 420 and 440 may thus alternate in conductivity or have some other relationship.

The pinned layer 450 is a multilayer including ferromagnetic layers 452 and 454. The ferromagnetic layer 452 is a PPMA layer 452, while the layer 454 is a PMA layer. As a result, the PPMA layer 452 can also have a magnetic moment perpendicular to plane. Further, in other embodiments, the pinned layer 450 may be another multilayer including but not limited to a SAF. However, as the moments of the pinned layers 410 and 450 are set using the method 160 or 200, the magnetic junction 400 is in an anti-dual state.

Thus, the magnetic junction 400 is one in which one or more of the pinned layer 410, the free layer 430 and the pinned layer 450 include PPMA layer(s) adjoining the nonmagnetic spacer layer 420 and/or 440. The magnetic moments of the layers 410, 430, and 450 are perpendicular to plane. As a result, the magnetic junction 400 may have enhanced magnetoresistance. Thus, in addition to being able to have its pinned layer magnetic moment(s) set using the method 160 or 200, the magnetic junction 400 may have enhanced magnetoresistance.

Figure 12:
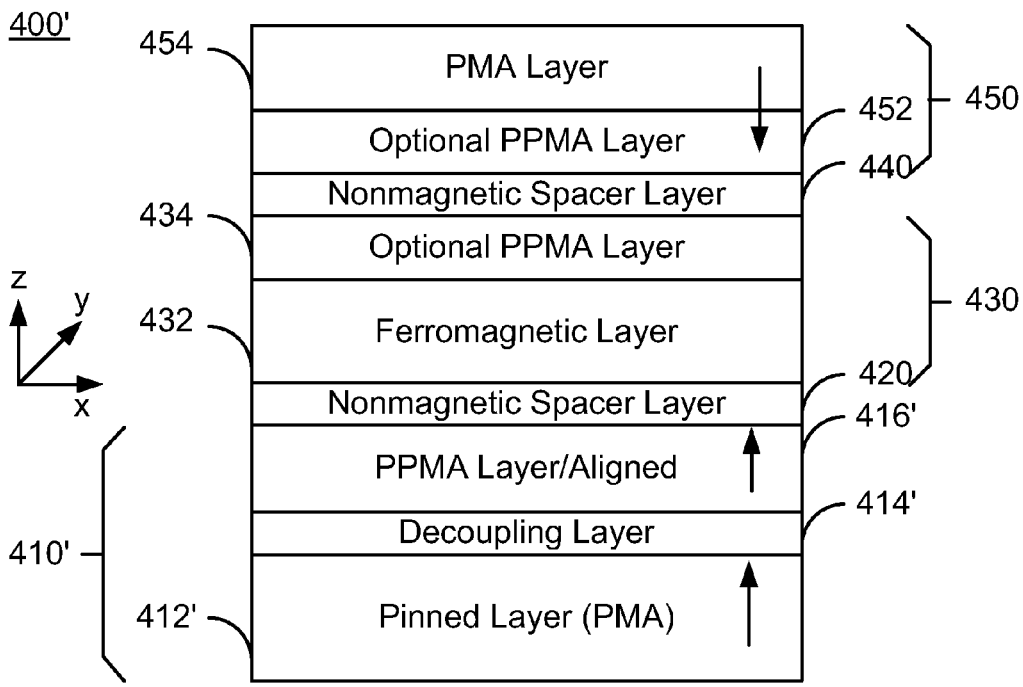
FIG. 12 depicts another exemplary embodiment of a magnetic junction capable of being written using spin transfer

FIG. 12 depicts an exemplary embodiment of a magnetic junction 400' usable in a magnetic memory such as an STT-MRAM. For clarity, FIG. 12 is not to scale. Further, the magnetic junction may be set into the desired state using the method 150 and/or 160. The magnetic junction 400' is analogous to the magnetic junction 400. Consequently, similar components have analogous labels. The magnetic junction 400' thus includes a pinned layer 410', a nonmagnetic spacer layer 420, a free layer 430, another nonmagnetic spacer layer 440, and a pinned layer 550 that are analogous to the pinned layer 410, the first nonmagnetic spacer layer 420, the free layer 430, the second nonmagnetic spacer layer 440, and the second pinned layer 450 depicted in FIG. 11. Thus, the structure and function of these components is analogous to that described above.

In addition, the pinned layer 410' includes pinned layer 412', a decoupling layer 414', and a PMA layer 416'. The layers 412' and 416' are still ferromagnetically aligned by the setting procedures described above. However, a decoupling layer 414' has replaced the nonmagnetic layer 414. The decoupling layer 414' may include materials such as Ta, Cr, Pd, Pt, Ti, W, Hf, Ge, Zr, Al, Mg, Ru or oxide or nitride of these materials. In some embodiments, the thickness of the decoupling layer 414' is at least five and not more than thirty Angstroms. The decoupling layer 414' is a seed layer for PPMA material(s), such as CoFeB, that provides a sufficiently high perpendicular anisotropy that the PMA layer 416' grown on the decoupling layer 414' is oriented perpendicular to plane without being exchange coupled to another layer.

The magnetic junction 400' may share the benefits of the magnetic junction 400, in which one or more of the pinned layer 410, the free layer 430 and the pinned layer 450 include PPMA layer(s) adjoining the nonmagnetic spacer layer 420 and/or 440. The magnetic moments of the layers 410, 430, and 450' are perpendicular to plane. As a result, the magnetic junction 400' may have enhanced magnetoresistance. Thus, in addition to being able to have its pinned layer magnetic moment(s) set using the method 160 or 200, the magnetic junction 300' may have enhanced magnetoresistance. Additional benefit of this structure is using layer 412' we can more easily cancel the offset field in the free layer 430.

Figure 13:
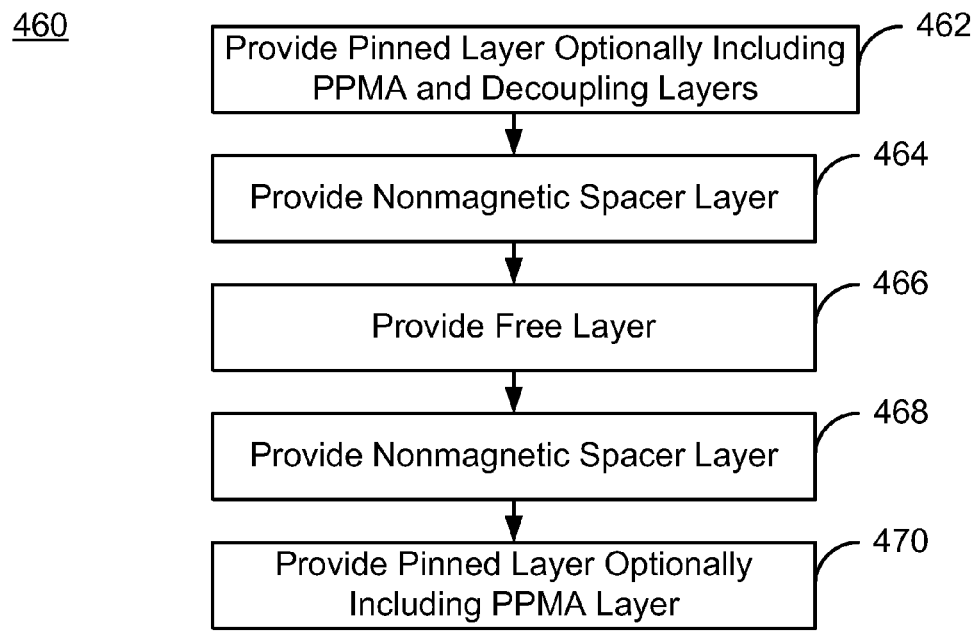
FIG. 13 is a flow chart depicting one embodiment of a method for providing the magnetic junction.

FIG. 13 depicts one embodiment of a method 460 for providing an exemplary embodiment of a dual magnetic junction. For simplicity, some steps may be omitted, combined, and/or interleaved. The method 460 is described in the context of the magnetic junction 400. However, the method 460 may be used to provide other magnetic junctions.

The pinned layer 410 is provided, via step 462. Step 462 includes providing a multilayer optionally including a PPMA layer. The PPMA and other ferromagnetic layers are desired to be ferromagnetically aligned. The nonmagnetic spacer layer 420 is provided, via step 464. In some embodiments, step 464 includes providing a tunneling barrier layer. The free layer 430 is provided via step 466. In some embodiments, the free layer 430 provided may include one or more PPMA layers. Another nonmagnetic spacer layer 440 is provided, via step 468. The pinned layer 450 is provided, via step 470. Step 470 may include providing a PPMR layer as part of the pinned layer 450. Thus, using the method 460, the benefits of one or more of the magnetic junctions 400 and 400' may be achieved Various magnetic junctions 100, 250, 300, 300', 300'', 400, and 400' and methods 160, 200, 360, and 460 have been disclosed. Note that various features of the magnetic junctions 100, 250, 300, 300', 300'', 400, and 400' and methods 160, 200, 360, and 460 may be combined. Thus, one or more of the benefits of the magnetic junctions 100, 250, 300, 300', 300'', 400, and 400' and methods 160, 200, 360, and 460 may be achieved.

Figure 14:
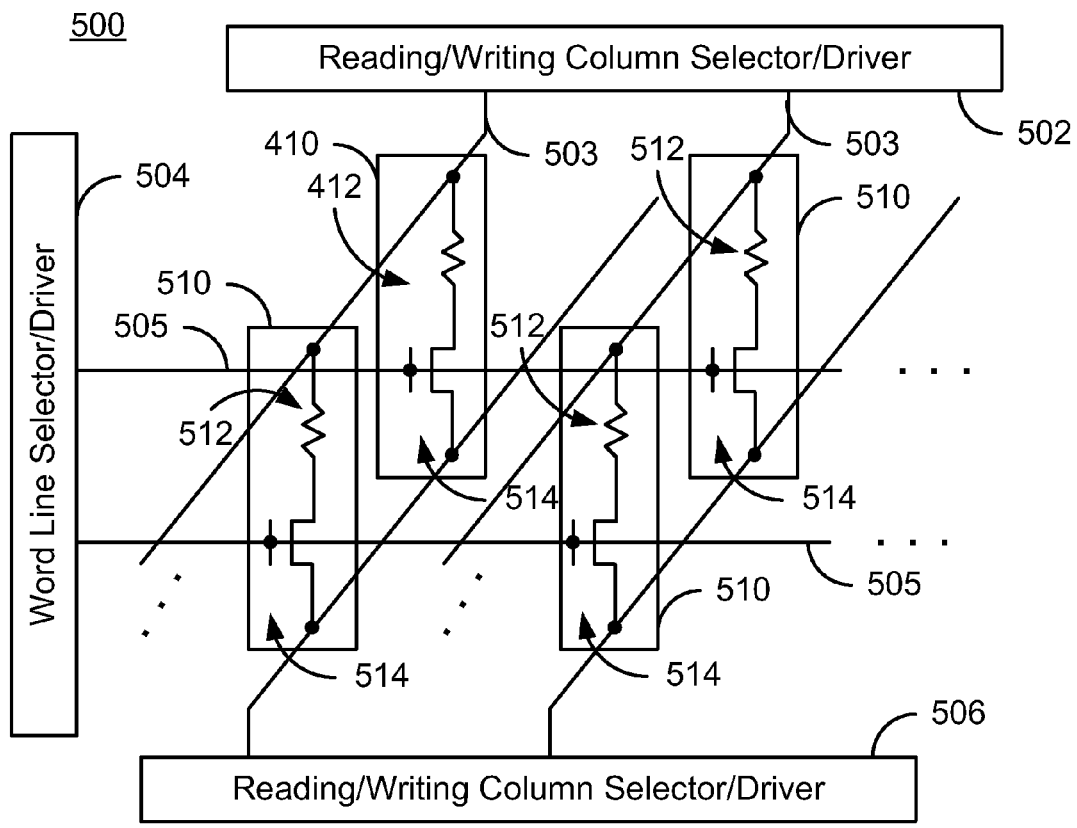
FIG. 14 depicts an exemplary embodiment of a memory utilizing magnetic junctions in the memory element(s) of the storage cell(s).

The magnetic junctions described herein may be used in a magnetic memory. FIG. 14 depicts an exemplary embodiment of one such memory 500. The magnetic memory 500 includes reading/writing column select drivers 502 and 506 as well as word line select driver 504. Note that other and/or different components may be provided. The storage region of the memory 500 includes magnetic storage cells 510. Each magnetic storage cell includes at least one magnetic junction 512 and at least one selection device 514. In some embodiments, the selection device 514 is a transistor. The magnetic junctions 512 may be one of the magnetic junctions 100, 250, 300, 300', 300'', 400', and/or 400'. Although one magnetic junction 512 is shown per cell 510, in other embodiments, another number of magnetic junctions 512 may be provided per cell. As such, the magnetic memory 500 may enjoy the benefits described above, such as higher density.

A method and system for providing a magnetic junction and a memory fabricated using the magnetic junction have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for setting a reference layer of a pinned layer in magnetic junction including a free layer, a nonmagnetic spacer layer, and the pinned layer, the nonmagnetic spacer layer residing between the pinned layer and the free layer, the pinned layer including a plurality of ferromagnetic layers interleaved with at least one spacer layer, the plurality of ferromagnetic layers including the reference layer and having at least one easy axis, at least a portion of the plurality of ferromagnetic layers being magnetically coupled by a coupling field, the at least the portion of the plurality of ferromagnetic layers including the reference layer and at least one other ferromagnetic layers, the method comprising:

applying a magnetic field in a direction parallel to an easy axis of the at least one easy axis, the magnetic field having a magnitude greater than a coercivity of each of the plurality of ferromagnetic layers and less than the coupling field between the at least the portion of the plurality of ferromagnetic layers, the coercivity of each of the plurality of ferromagnetic layers being less than the coupling field, a ferromagnetic layer of the plurality of ferromagnetic layers having a saturation magnetic moment greater than a reference layer saturation magnetic moment, the reference layer being between the ferromagnetic layer and the free layer.

2. The method of claim 1 wherein the saturation magnetic moment of the ferromagnetic layer is greater than any saturation magnetic moment of any remaining layer of the plurality of ferromagnetic layers and wherein the direction is parallel to the easy axis for the ferromagnetic layer.

3. The method of claim 2 wherein the ferromagnetic layer is a ferromagnetic pinned layer.

4. A method for setting a reference layer of a pinned layer in magnetic junction including a free layer, a nonmagnetic spacer layer, and the pinned layer, the nonmagnetic spacer layer residing between the pinned layer and the free layer, the pinned layer including a plurality of ferromagnetic layers interleaved with at least one spacer layer, the plurality of ferromagnetic layers including the reference layer and having at least one easy axis, at least a portion of the plurality of ferromagnetic layers being magnetically coupled by a coupling field, the at least the portion of the plurality of ferromagnetic layers including the reference layer and at least one other ferromagnetic layers, the method comprising:

applying a magnetic field in a direction parallel to an easy axis of the at least one easy axis, the magnetic field having a magnitude greater than a coercivity of each of the plurality of ferromagnetic layers and less than the coupling field between the at least the portion of the plurality of ferromagnetic layers, the coercivity of each of the plurality of ferromagnetic layers being less than the coupling field;

wherein the reference layer has a saturation magnetic moment greater than any saturation magnetic moment of any remaining layer of the plurality of ferromagnetic layers and wherein the direction is parallel to the easy axis for the ferromagnetic layer.

5. A method for setting a reference layer of a pinned layer in magnetic junction including a free layer, a nonmagnetic spacer layer, and the pinned layer, the nonmagnetic spacer layer residing between the pinned layer and the free layer, the pinned layer including a plurality of ferromagnetic layers interleaved with at least one spacer layer, the plurality of ferromagnetic layers including the reference layer and having at least one easy axis, at least a portion of the plurality of ferromagnetic layers being magnetically coupled by a coupling field, the at least the portion of the plurality of ferromagnetic layers including the reference layer and at least one other ferromagnetic layers, the method comprising:

applying a magnetic field in a direction parallel to an easy axis of the at least one easy axis, the magnetic field having a magnitude greater than a coercivity of each of the plurality of ferromagnetic layers and less than the coupling field between the at least the portion of the plurality of ferromagnetic layers, the coercivity of each of the plurality of ferromagnetic layers being less than the coupling field;

wherein the magnetic junction further includes an additional nonmagnetic spacer layer and an additional pinned layer, the additional nonmagnetic spacer layer residing between the free layer and the additional pinned layer, the free layer being between the nonmagnetic spacer layer and the additional nonmagnetic spacer layer, the additional pinned layer having an additional pinned layer coercivity, the magnitude of the magnetic field being greater than the additional pinned layer coercivity.

6. The method of claim 1 wherein the nonmagnetic spacer layer is a tunneling barrier layer.

7. The method of claim 1 wherein the direction is perpendicular to plane.

8. The method of claim 1 wherein the at least the portion of the plurality of ferromagnetic layers includes all of the ferromagnetic layers.

* * * * *